(12) United States Patent
Weber et al.

(10) Patent No.: US 6,385,429 B1
(45) Date of Patent: May 7, 2002

(54) RESONATOR HAVING A PIEZOCERAMIC/POLYMER COMPOSITE TRANSDUCER

(75) Inventors: Scott D. Weber, Canandaigua; Dale R. Mashtare, Bloomfield; Christopher Snelling, Rochester; Bernard Leibman, Webster, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/716,368

(22) Filed: Nov. 21, 2000

(51) Int. Cl.$^7$ .......................... G03G 15/16; H01L 41/04
(52) U.S. Cl. ........................................ 399/319; 310/357
(58) Field of Search ................................. 399/296, 297, 399/319, 390; 310/311, 313 A, 323.19, 325, 349, 357, 367, 369, 371; 347/27, 48, 68

(56) References Cited

U.S. PATENT DOCUMENTS

| | | | |
|---|---|---|---|
| 3,113,225 A | 12/1963 | Kleesattel et al. ............. 310/26 |
| 3,190,793 A | 6/1965 | Starke ........................ 162/279 |
| 3,422,479 A | 1/1969 | Jeffee ......................... 15/100 |
| 3,635,762 A | 1/1972 | Ott et al. ........................ 134/1 |
| 3,653,758 A | 4/1972 | Trimmer et al. ............ 399/319 |
| 3,713,987 A | 1/1973 | Low ......................... 435/309.1 |
| 3,733,238 A | 5/1973 | Long et al. ................. 546/120 |
| 3,854,974 A | 12/1974 | Sato et al. ................... 430/126 |
| 4,007,982 A | 2/1977 | Stange ........................ 399/351 |
| 4,111,546 A | 9/1978 | Maret ......................... 399/349 |
| 4,121,947 A | 10/1978 | Hemphill ....................... 134/1 |
| 4,363,992 A | 12/1982 | Holze, Jr. ................. 310/323.19 |
| 4,483,034 A | 11/1984 | Andersson ................. 15/119.2 |
| 4,546,722 A | 10/1985 | Toda et al. .................. 399/267 |
| 4,568,955 A | 2/1986 | Hosoya et al. ................ 347/55 |
| 4,684,242 A | 8/1987 | Schultz ....................... 399/343 |
| 4,794,878 A | 1/1989 | Connors et al. ............. 399/265 |
| 4,833,503 A | 5/1989 | Snelling ...................... 399/231 |
| 4,933,230 A | * 6/1990 | Card et al. ................... 310/357 |
| 4,987,456 A | 1/1991 | Snelling et al. ............. 399/319 |
| 5,005,054 A | 4/1991 | Stokes et al. ................ 399/319 |
| 5,010,369 A | 4/1991 | Nowak et al. ............... 399/319 |
| 5,016,055 A | 5/1991 | Pietrowski et al. .......... 399/390 |
| 5,025,291 A | 6/1991 | Nowak et al. ............... 399/390 |
| 5,030,999 A | 7/1991 | Lindblad et al. ............ 399/349 |
| 5,081,500 A | 1/1992 | Snelling ...................... 399/319 |
| 5,210,577 A | 5/1993 | Nowak ........................ 399/296 |
| 5,282,005 A | 1/1994 | Nowak et al. ............... 399/319 |
| 5,329,341 A | 7/1994 | Nowak et al. ............... 399/319 |
| 5,493,372 A | 2/1996 | Mashtare et al. ........... 399/313 |
| 5,523,827 A | 6/1996 | Snelling et al. ............. 399/285 |
| 5,702,629 A | * 12/1997 | Cui et al. .................... 310/313 |

FOREIGN PATENT DOCUMENTS

| | | |
|---|---|---|
| FR | 2280115 | 3/1976 |
| JP | 62-195685 | 8/1987 |

OTHER PUBLICATIONS

D. Fiore et al., "Recent Developments in 1–3 Piezocomposite Transducer Fabrication", IEEE, 1996, pp. 531–534.

* cited by examiner

Primary Examiner—Sophia S. Chen
Assistant Examiner—Hoan Tran
(74) Attorney, Agent, or Firm—Oliff & Berridge, PLC

(57) ABSTRACT

A resonator for applying vibrational energy to a member, for example a photoreceptor belt or developer/donor member, includes an energy transmitting horn member having a platform portion and a horn portion, the horn portion including a contacting portion for contacting a surface of the member, and a piezoelectric material in association with the horn member for driving the horn member to vibrate, the piezoelectric material responsive to a voltage signal from a voltage source. The piezoelectric material is a composite of at least one piezoceramic material and at least one of a polymer or air, and has a 1–3 configuration. By the selection of a piezoceramic/polymer composite material having the specified configuration for use as the vibratory energy producing source, or transducer, of a resonator, improved piezoelectric material performance is achieved, particularly with respect to control and/or elimination of undesired transverse vibration, and manufacturing complexity is reduced.

22 Claims, 7 Drawing Sheets

RESONATOR HAVING A PIEZOCERAMIC/POLYMER COMPOSITE TRANSDUCER

BACKGROUND OF THE INVENTION

1. Field of the Invention

This invention relates to a resonator for uniformly applying high frequency vibratory energy to a member in contact with the resonator with optimal energy transfer. More in particular, the invention relates to a resonator including an improved piezoelectric transducer.

2. Description of Related Art

In electrophotographic applications such as xerography, a charge retentive surface is electrostatically charged and exposed to a light pattern of an original image to be reproduced to selectively discharge the surface in accordance therewith. The resulting pattern of charged and discharged areas on that surface form an electrostatic charge pattern (an electrostatic latent image) conforming to the original image. The latent image is developed by contacting it with a finely divided electrostatically attractable powder or powder suspension referred to as "toner," which may be present along with carrier particles in a developer composition. Toner is held on the image areas by the electrostatic charge on the surface. Thus, a toner image is produced on the charge retentive surface in conformity with a light image of the original being reproduced. The toner image may then be transferred to a substrate (e.g., paper), and the image affixed thereto to form a permanent record of the image to be reproduced. Subsequent to development, excess toner left on the charge retentive surface is cleaned from the surface.

The process is well known and useful for light lens copying from an original and printing applications from electronically generated or stored originals, where a charged surface may be imagewise discharged in a variety of ways. Ion projection devices where a charge is imagewise deposited on a charge retentive substrate operate similarly. In a slightly different arrangement, toner may be transferred to an intermediate surface, prior to retransfer to a final substrate.

Transfer of toner from the charge retentive surface to the final substrate is commonly accomplished electrostatically. A developed toner image is held on the charge retentive surface with electrostatic and mechanical forces. A substrate (such as a copy sheet) is brought into intimate contact with the surface, sandwiching the toner thereinbetween. An electrostatic transfer charging device, such as a corotron, applies a charge to the back side of the sheet, to attract the toner image to the sheet.

The interface between the sheet and the charge retentive surface is not always optimal. Particularly with non-flat sheets, such as sheets that have already passed through a fixing operation such as heat and/or pressure fusing, or perforated sheets, or sheets that are brought into imperfect contact with the charge retentive surface, the contact between the sheet and the charge retentive surface may be non-uniform, characterized by gaps where contact has failed. There is a tendency for toner not to transfer across these gaps. A copy quality defect results.

That acoustic agitation or vibration of a surface can enhance toner release therefrom is known, for example as described in U.S. Pat. No. 4,111,546 to Maret, U.S. Pat. No. 4,684,242 to Schultz, U.S. Pat. No. 4,007,982 to Stange, U.S. Pat. No. 4,121,947 to Hemphill, U.S. Pat. No. 3,653,758 to Trimmer et al., U.S. Pat. No. 4,546,722 to Toda et al., U.S. Pat. No. 4,794,878 to Connors et al., U.S. Pat. No. 4,833,503 to Snelling, Japanese Published Patent Application 62-195685, U.S. Pat. No. 3,854,974 to Sato et al., and French Patent No. 2,280,115.

Coupling of vibrational energy to a surface has been considered in, for example, U.S. Pat. No. 3,635,762 to Ott et al., U.S. Pat. No. 3,422,479 to Jeffee, U.S. Pat. No. 4,483,034 to Ensminger and U.S. Pat. No. 3,190,793 Starke.

Resonators coupled to the charge retentive surface of an electrophotographic device at various stations therein, for the purpose of enhancing the electrostatic function, are known, for example as in: U.S. Pat. No. 5,210,577 to Nowak; U.S. Pat. No. 5,005,054, to Stokes et al.; U.S. Pat. No. 5,010,369 to Nowak et al.; U.S. Pat. No. 5,025,291 to Nowak et al.; U.S. Pat. No. 5,016,055 to Pietrowski et al.; U.S. Pat. No. 5,081,500 to Snelling; U.S. Pat. No. 5,282,005 to Nowak et al.; U.S. Pat. No. 5,329,341 to Nowak et al.; and U.S. Pat. No. 5,493,372 to Mashtare et al.

In addition, resonators for applying vibrational energy to some other member of the device are known, for example as described in U.S. Pat. No. 4,363,992 to Holze, Jr., U.S. Pat. No. 3,113,225 to Kleesattel et al., U.S. Pat. No. 3,733,238 to Long et al., U.S. Pat. No. 3,713,987 to Low and U.S. Pat. No. 5,030,999 to Lindblad et al. U.S. Pat. No. 4,546,722 to Toda et al., U.S. Pat. No. 4,794,878 to Connors et al. and U.S. Pat. No. 4,833,503 to Snelling describe ultrasonic transducer-driven toner transfer for a development system, in which a vibration source provides a wave pattern to move or assist in movement of toner from a sump to a photoreceptor. U.S. Pat. No. 4,568,955 to Hosoya et al. teaches recording apparatus with a developing roller carrying developer to a recording electrode, and a signal source for propelling the developer from the developing roller to the recording media.

In the ultrasonic welding horn art, for example as exemplified in U.S. Pat. No. 4,363,992 to Holze, Jr., where blade-type welding horns are used for applying high frequency energy to surfaces, it is known that the provision of slots through the horn perpendicular to the direction in which the welding horn extends, reduces undesirable mechanical coupling of effects across the contacting horn surface. Accordingly, in such art, the contacting portion of the horn is maintained as a continuous surface, the horn portion is segmented into a plurality of segments, and the horn platform, support and piezoelectric driver elements are maintained as continuous members. For uniformity purposes, it has been desirable to segment the horn so that each segment acts individually.

It has been noted that even with fully segmented horns, as shown in U.S. Pat. No. 5,010,369 to Nowak et al., there is a fall-off in response of the resonator at the outer edges of the device. A similar fall off is shown in U.S. Pat. No. 4,363,992 to Holze, Jr., at FIG. 2, showing the response of the resonator of FIG. 1.

U.S. Pat. No. 5,493,372 to Mashtare et al. describes an imaging device having a non-rigid member with a charge retentive surface moving along an endless path, an imaging system for creating a latent image on the charge retentive surface, a developer for imagewise developing the latent image with toner, a transfer system for electrostatically transferring the developed toner image to a copy sheet, and a resonator for enhancing toner release from the charge retentive surface, producing relatively high frequency vibratory energy and having a portion thereof adapted for contact across the flexible belt member, generally transverse to the direction of movement thereof. The resonator includes a horn member for applying the high frequency vibratory energy to the non-rigid member, having a platform portion, a horn portion, and a contacting portion extending across the non-rigid member. A vibratory energy producing device is coupled to the horn platform for generating the high frequency vibratory energy required to drive said horn member, the vibratory energy producing device including a piezoelectric polymer film material such as polyvinylidene fluoride or composite materials of piezoelectric active ceramic particles randomly mixed throughout a polymer binder (see column 5, lines 13–26). This device does not describe composites or configurations of the present invention.

Current transducer designs in horn assemblies suffer from tip vibration amplitude uniformity problems. Specifically, it is difficult to achieve uniform vibration across the entire surface of the piezoelectric element in the desired vertical direction, known transducer materials used to date exhibiting some degree of undesired transverse vibration. Moreover, current transducer designs also have manufacturing difficulties associated with bonding numerous segments of piezoelectric elements, e.g., lead zirconate titanate (PZT), to the aluminum waveguide of the horn assembly.

What is still sought is an improved piezoelectric element for use in a horn assembly that renders the horn assembly easier and relatively inexpensive to manufacture, as well as exhibits improved uniformity of vibration. This need is particularly strong in the ultrasonic energy applying applications used in electrophotographic printers, where the demand for high quality, electrophotographic printers continues to increase.

SUMMARY OF THE INVENTION

It is therefore one object of the present invention to develop a horn assembly and piezoelectric material for use therein that allows for a simplified, cost reduced assembly.

It is a further object of the present invention to develop a horn assembly and piezoelectric material for use therein that achieves more desirable performance, particularly improved vibration uniformity.

These and other objects are obtained by the present invention. In a first aspect, the present invention relates to a resonator for applying vibrational energy to a member, comprising an energy transmitting horn member having a platform portion and a horn portion, the horn portion including a contacting portion for contacting a surface of the member, and a piezoelectric material in association with the horn member for driving the horn member to vibrate, the piezoelectric material responsive to a voltage signal from a voltage source, wherein the piezoelectric material comprises a composite of at least one piezoceramic material and at least one of a polymer or air, and wherein the composite has a 1–3 configuration.

In a second aspect, the invention relates to an imaging apparatus including the resonator. More in particular, it relates to an imaging apparatus comprising at least a non-rigid member with a charge retentive surface moving along an endless path, an image forming station for creating a latent image on the charge retentive surface, a developing station for imagewise developing the latent image with toner, a transfer station for electrostatically transferring the developed toner image to a substrate, and a resonator comprising an energy transmitting horn member having a platform portion and a horn portion, the horn portion including a contacting portion for contacting a surface of the non-rigid member, and a piezoelectric material in association with the horn member for driving the horn member to vibrate, the piezoelectric material responsive to a voltage signal from a voltage source, wherein the piezoelectric material comprises a composite of at least one piezoceramic material and at least one of a polymer or air, and wherein the composite has a 1–3 configuration.

In a further aspect, the invention also relates to a method of making the resonator. In particular, the invention relates to an improved manufacturing process in which the piezoceramic/polymer composite is directly injection molded to the platform portion of the horn member, thereby creating a strong bond in a simple and cost effective manner.

By the selection of a piezoceramic/polymer composite material having the specified configuration for use as the vibratory energy producing source, or transducer, of a resonator, improved piezoelectric material performance is achieved, particularly with respect to control and/or elimination of undesired transverse vibration, and manufacturing complexity is reduced.

DETAILED DESCRIPTION OF PREFERRED EMBODIMENTS

Imaging apparatuses, i.e., printing machines, of the type contemplated or use with the present invention are well known and need not be described herein. U.S. Pat. No. 5,210,577 to Nowak; U.S. Pat. No. 5,030,999 to Lindblad et al.; U.S. Pat. No. 5,005,054 to Stokes et al.; U.S. Pat. No. 4,987,456 to Snelling et al.; U.S. Pat. No. 5,010,369 to Nowak et al.; U.S. Pat. No. 5,025,291 to Nowak et al.; U.S. Pat. No. 5,016,055 to Pietrowski et al.; U.S. Pat. No. 5,081,500 to Snelling; U.S. Pat. No. 5,282,005 to Nowak, et al.; and U.S. Pat. No. 5,329,341 to Nowak et al adequately describe such devices, and the application of transfer improving vibration inducing devices, and are specifically incorporated herein by reference.

Figure 1:
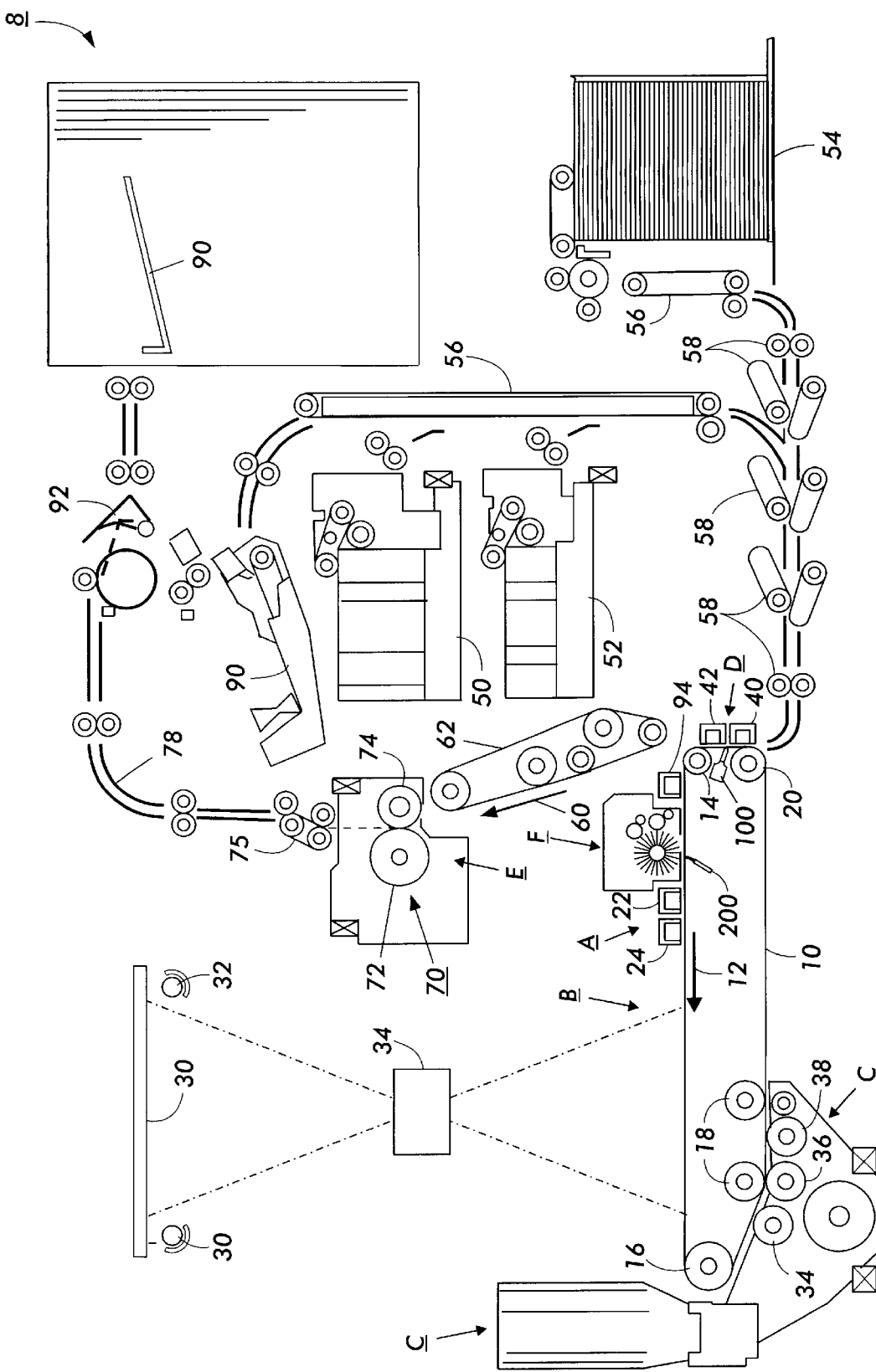
FIG. 1 is a schematic view of a printing machine and the associated resonator of the invention, the resonator being located so as to function as a toner transfer enhancement device.

Referring to the drawings, where the showings are for the purpose of describing preferred embodiments of the invention and not for limiting the same, the various processing stations employed in the printing or reproduction machine illustrated in FIG. 1 will be described only briefly. It will no doubt be appreciated that the various processing elements also find advantageous use in electrophotographic printing applications from an electronically stored original.

An apparatus in which the resonator of the present invention finds advantageous use utilizes a flexible photoreceptor belt 10, more generally also referred to as a non-rigid member. Belt 10 moves in the direction of arrow 12 to advance successive portions of the belt sequentially through the various processing stations disposed about the path of movement thereof.

Belt 10 may be entrained about stripping roller 14, tension roller 16, idler rollers 18, and drive roller 20. Drive roller 20 is coupled to a motor (not shown) by suitable means such as a belt drive.

Belt 10 is maintained in tension by a pair of springs (not shown) resiliently urging tension roller 16 against belt 10 with the desired spring force. Both stripping roller 18 and tension roller 16 are rotatably mounted. These rollers are idlers that rotate freely as belt 10 moves in the direction of arrow 16.

Initially a portion of belt 10 passes through charging station A. At charging station A, a pair of corona devices 22 and 24 charge photoreceptor belt 10 to a relatively high, substantially uniform potential, for example a negative potential.

At exposure or image forming station B, an original document is positioned face down on a transparent platen 30 for illumination with flash lamps 32. Light rays reflected from the original document are reflected through a lens 34 and projected onto a charged portion of photoreceptor belt 10 to selectively dissipate the charge thereon. This records an electrostatic latent image on the belt which corresponds to the informational area contained within the original document. Besides the system described above, any other suitable system known to practitioners in the art may be used without restriction to form the latent image.

Thereafter, belt 10 advances the electrostatic latent image to development station C that includes one or more developer (i.e., donor or toner supply) members.

At development station C, a developer unit 38 advances one or more colors or types of toner or developer mix (i.e., toner and carrier granules) into contact with the electrostatic latent image. The latent image attracts the toner particles from the carrier granules thereby forming toner powder images corresponding to the latent image on the surface of the photoreceptor belt 10. As known in the art, several development units may be used in succession for applying separate colors.

In one embodiment of the invention, the development station may include a developer or donor member that moves along an endless path. The resonator of the invention contacts the surface of this member to acoustically vibrate the surface and effect toner release, thereby creating a toner cloud for development. See e.g., U.S. Pat. No. 5,523,827, incorporated herein by reference.

Belt 10 then advances the developed latent image to transfer station D. At transfer station D, an image receiving substrate such as a paper copy sheet or transparency is moved into contact with the developed latent images on belt 10. In this step, for example, the latent image on belt 10 may be exposed to a pre-transfer light from a lamp (not shown) to reduce the attraction between photoreceptor belt 10 and the toner powder image thereon. Next, corona generating device 40 charges the copy sheet to the proper potential so that it is tacked to photoreceptor belt 10 and the toner powder image is attracted from photoreceptor belt 10 to the sheet. After transfer, a corona generator 42 charges the copy sheet to an opposite polarity to detack the copy sheet for belt 10, whereupon the sheet is stripped from belt 10 at stripping roller 14.

Substrate sheets are advanced to transfer station D from supply trays, 50, 52 and 54, which may hold different quantities, sizes and types of support materials. Sheets are advanced to transfer station D along conveyor 56 and rollers 58.

After transfer, the sheet continues to move in the direction of arrow 60 onto a conveyor 62 which advances the sheet to fusing station E. Fusing station E includes a fuser assembly, indicated generally by the reference numeral 70, which permanently affixes the transferred toner powder images to the sheets. Preferably, fuser assembly 70 includes a heated fuser roller 72 adapted to be pressure engaged with a back-up roller 74 with the toner powder images contacting fuser roller 72. In this manner, the toner powder image is permanently affixed to the sheet.

After fusing, copy sheets bearing fused images are directed through decurler 76. Chute 78 guides the advancing sheet from decurler 76 to catch tray 80 or a finishing station for binding, stapling, collating, etc. and removal from the machine by the operator. Alternatively, the sheet may be advanced to a duplex tray 90 from duplex gate 92 from which it will be returned to the processor and conveyor 56 for receiving second side copy.

A pre-clean corona generating device 94 is provided for exposing residual toner and contaminants remaining on the surface of the belt 10 after transfer station D (hereinafter, collectively referred to as toner) to corona to thereby narrow the charge distribution thereon for more effective removal at cleaning station F. It is contemplated that residual toner remaining on photoreceptor belt 10 after transfer will be reclaimed and returned to the developer station C by any of several well known reclaim arrangements, and in accordance with arrangement described below, although selection of a non-reclaim option is possible.

As thus described, a reproduction machine in accordance with the present invention may be any of several well known devices. Variations may be expected in specific processing, paper handling and control arrangements without affecting the present invention.

The beneficial vibratory energy imparted by a resonator may be coupled to a non-rigid member such as belt 10 in a number of ways. For example, a resonator may contact (1) a photoreceptor member at or near transfer station D in order to assist in transfer of the toner image to the substrate, (2) a photoreceptor member before transfer station D in order to adjust properties of the toner image such as level the toner image (i.e., pre-transfer image modification), (3) a developer (or toner supply) member of development station C in order to create a toner cloud for development, (4) a photoreceptor member at or near cleaning station F to assist in loosening the toner for easier removal during the cleaning step, etc.

A most preferred embodiment of the present invention employs the resonator of the invention in the toner transfer step so as to assist in the transfer of the image from the surface of the belt 10 to a substrate. This embodiment is explained more fully below to assist in an understanding of the operation of the resonator of the present invention.

Figure 2:
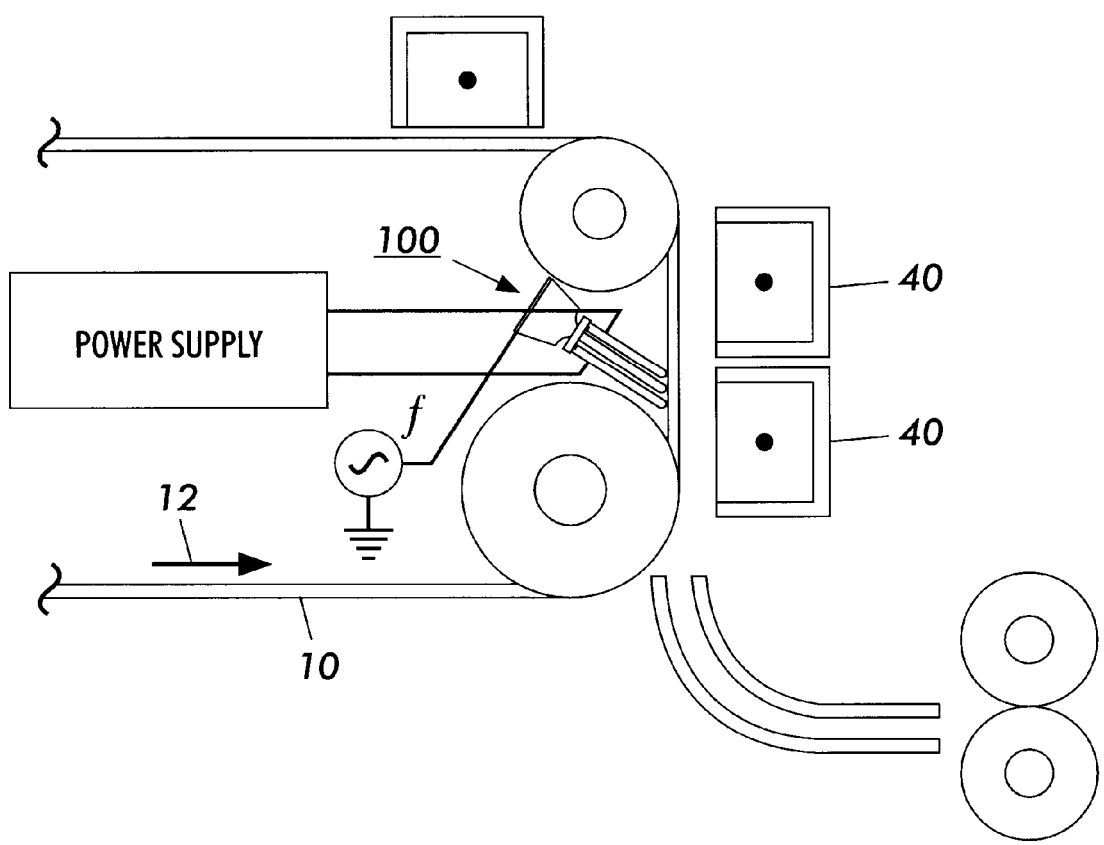
FIG. 2 is a schematic elevational view of a printing machine transfer station and the associated resonator of the invention.

With reference to FIG. 2, wherein a portion of the printing machine is shown including at least portions of the transfer, detack and precleaning functions thereof, the basic principle of enhanced toner release is illustrated, where a relatively high frequency acoustic or ultrasonic resonator 100 driven by a power supply, for example an A.C. source operated at a frequency f between, for example, about 20 kHz and about 200 kHz, is arranged in vibrating relationship with the interior or back side of the belt 10, at a position closely adjacent to where the belt passes through the transfer station. Vibration of belt 10 via the resonator agitates toner developed in imagewise configuration onto belt 10 for mechanical release thereof from belt 10, allowing the toner to be electrostatically attracted to a sheet during the transfer step, despite gaps caused by imperfect image receiving substrate contact with belt 10. Additionally, increased transfer efficiency with lower transfer fields than normally used appears possible with the arrangement. Lower transfer fields are desirable because the occurrence of air breakdown (another cause of image quality defects) is reduced. Increased toner transfer efficiency is also expected in areas where contact between the sheet and belt 10 is optimal, resulting in improved toner use efficiency, and a lower load on the cleaning system. In a preferred arrangement, the resonator 100 is arranged with a vibrating surface parallel to belt 10 and transverse to the direction of belt movement 12, generally with a length approximately co-extensive with the belt width.

The belt described herein has the characteristic of being non-rigid, or somewhat flexible, to the extent that it can be made to follow the resonator vibrating motion. One type of photoconductive imaging member is typically multilayered and has a substrate, a conductive layer, an optional adhesive layer, an optional hole blocking layer, a charge generating layer, a charge transport layer, and, in some embodiments, an anti-curl backing layer.

Figure 3:
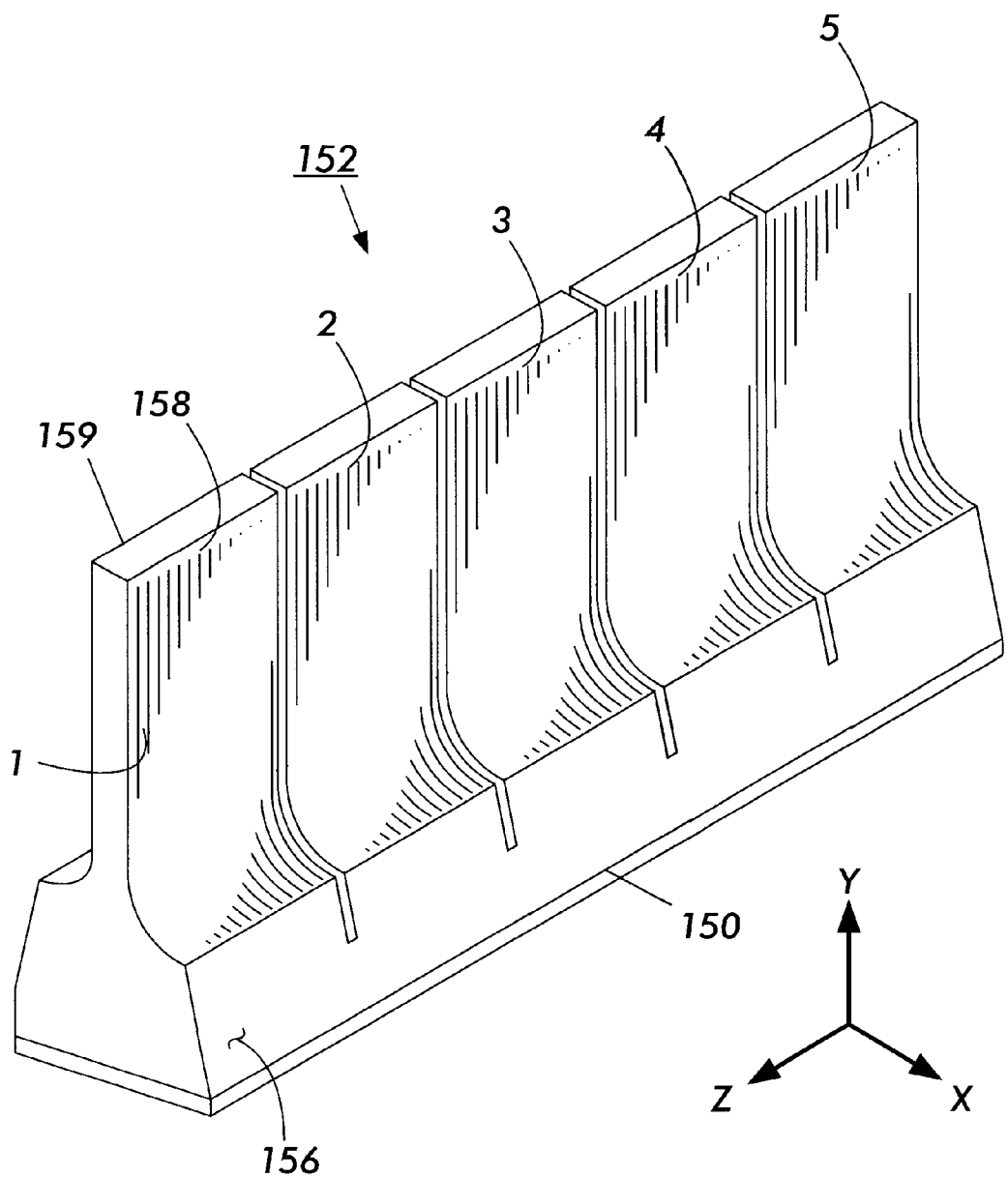
FIG. 3 is a perspective view of a resonator of the invention.

With reference to FIG. 3, the resonator comprises piezoelectric transducer element 150 and horn member 152. A desirable material for the horn member is aluminum, although other suitable materials may be used, if desired. The horn member 152 includes both base or platform section 156 and tip or horn section 158, in unitary construction. The piezoelectric element 150 generates the vibrational motion, and horn member 152 transfers and applies the motion to the belt.

Piezoelectricity is the ability of certain crystalline materials to develop an electrical charge proportional to a mechanical stress. The converse of this is also true. If voltage is applied across the crystalline material, it will show a mechanical strain. Piezoelectricity is the result of a non-symmetrical crystal structure. The most important crystal structure in studying piezoelectricity is the Perovskite structure. Some common piezoelectric materials that are used today include quartz single crystals, barium titanate and lead zirconate titanate (PZT) families of polycrystalline ceramics, along with certain semicrystalline polymers such as polyvinylidene fluoride (PVDF).

However, as was discussed above, current resonator designs suffer from tip vibration amplitude uniformity problems. In other words, vibration is desired in the vertical direction perpendicular to the surface of the belt, but existing resonators do not apply such desired vibration to the belt in a consistent and uniform manner across the entire surface of the resonator. The present inventors have found that this uniformity problem can be attributed in large part to the conventional piezoelectric materials vibrating to some extent in the undesired transverse direction. This transverse mode vibration can propagate through the transducer assembly, leading to nonuniform tip vibration amplitude along the length of the transducer.

By the present invention, the inventors have discovered that use of a composite of at least one piezoelectric active ceramic (hereinafter referred to as a piezoceramic) and at least one of one or more polymers or air and having a 1–3 configuration as the piezoelectric element can substantially reduce, and preferably eliminate, the undesired vibration in the transverse direction. This, in turn, permits more uniform and reliable vibration to be applied by the resonator across its entire surface.

Properties of the piezoelectric material constituents may be selected to provide optimal displacement and coupling to the ultrasonic waveguide based upon the piezoelectric constant and elastic moduli. The preferred modulus range may be between, for example, about $0.2 \times 10^{10}$ $Nm^2$ to about $1.0 \times 10^{10}$ $Nm^2$. Additionally, these properties may be selected to effect the vibration uniformity of the assembled transducer. To achieve the desired effect, the material stiffness may be selected to alter the cross process vibrational modes.

The piezoceramic material may include one or more of barium titanate ($BaTiO_3$), lead zirconate titanate (PZT), or lead titanate ($PbTiO_3$). Most preferably, the piezoceramic is PZT. The polymer of the composite may include any suitable binder polymer, and may or may not itself be piezoelectric. Piezoelectric polymers include polyvinylidene fluoride (PVDF), and copolymers of vinylidene fluoride and trifluoroethylene (P(VDF/TrFe)) or vinylidene fluoride and tetrafluoroethylene P(VDF/TeFe). Other binder polymers may include, for example, epoxies, silicone resins, cyanoacrylates, etc., without restriction. Preferably, as the piezoelectric element needs to be attached to the horn member, a preferred polymer is an epoxy in that it can also act to strongly adhere the piezoelectric composite to the platform section of the horn member.

The 1–3 configuration nomenclature that identifies the configuration of the piezoelectric composite transducer is known in the art and refers to the two-phase piezoelectric behavior of the material, the first number referencing the physical connectivity of the active phase (z direction) and the second number referencing the physical connectivity of the passive phase (y direction). The 1–3 composite configurations have been found to be most advantageous in achieving consistently uniform tip vibration amplitude in the resonator design of the invention.

The 1–3 composite configuration is selected to inherently attenuate the transverse vibrational modes, while efficiently achieving sufficient vibratory energy in the normal direction (i.e., the z direction, or through the thickness). This material is preferentially oriented to provide this significant vibration differential and as applied provides reduced stiffness in the transverse direction, thereby reducing coupling of these transverse modes.

Figure 4:
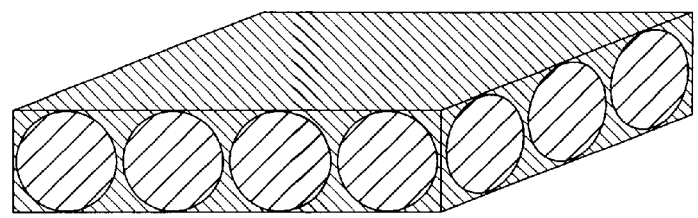
FIGS. 4, 5 and 6 are composite piezoceramic/polymer elements having 1–3 configurations.
Figure 5:
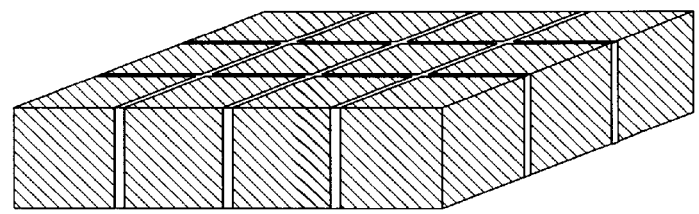
Figure 6:
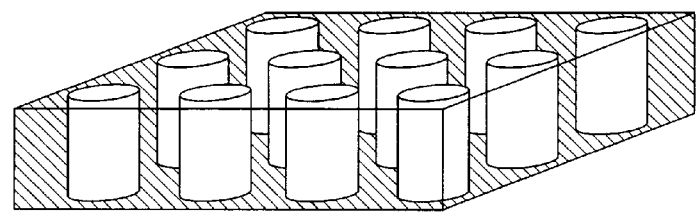

Suitable example 1–3 configurations are shown in FIGS. 4, 5 and 6. FIG. 4 illustrates a composite of uniformly spaced apart and aligned piezoceramic spheres in a polymer binder. The spheres may have any size on the order of the active layer thickness, i.e., microns to a few mm. FIG. 5 illustrates a composite of aligned piezoceramic cubes separated from each other with a polymer binder. FIG. 6 illustrates a composite of aligned, unidirectional piezoceramic rods, hollow or solid, in a polymer binder. For these types of configurations, particularly the configuration of FIG. 6, the polymer may be omitted in the composite in favor of air as a material separating the piezoceramic materials while still achieving the goal of reduced transverse vibration energy coupling. The rod 1–3 configuration of FIG. 6 is most preferred.

The piezoceramic material, for example PZT, may be formed by molding to the desired shape and then sintering to the final form. This method is particularly advantageous for the preferred rod configuration.

Bonding of the piezoelectric composite material (piezoelectric transducer element 150) to the aluminum horn member (i.e., waveguide) 152 on base or platform section 156 may be done through any number of suitable methods. For example, the piezoelectric composite may be bonded with an adhesive layer to horn 152. A vast array of adhesives such as transfer adhesives, epoxies, cyanoacrylates, or an epoxy/conductive mesh (e.g., metal screen) layer may be used to bond the horn and piezoelectric element together.

A preferred embodiment, however, is to directly bond the piezoelectric transducing element onto the ultrasonic waveguide thereby eliminating the bonding layer. This alleviates any vibration attenuation that may occur due to the bond layer as well as eliminates capacitive effects of the bond layer for electrical driving purposes. In this method, the polymer of the composite is chosen so as to also function as a bonding agent. Epoxy and cyanoacrylate resins are preferred polymers. Epoxies in particular are preferred for the polymer component of the composite in that they can be applied in conjunction with thermal or chemical reactions to create the bond to the aluminum waveguide.

Figure 8:
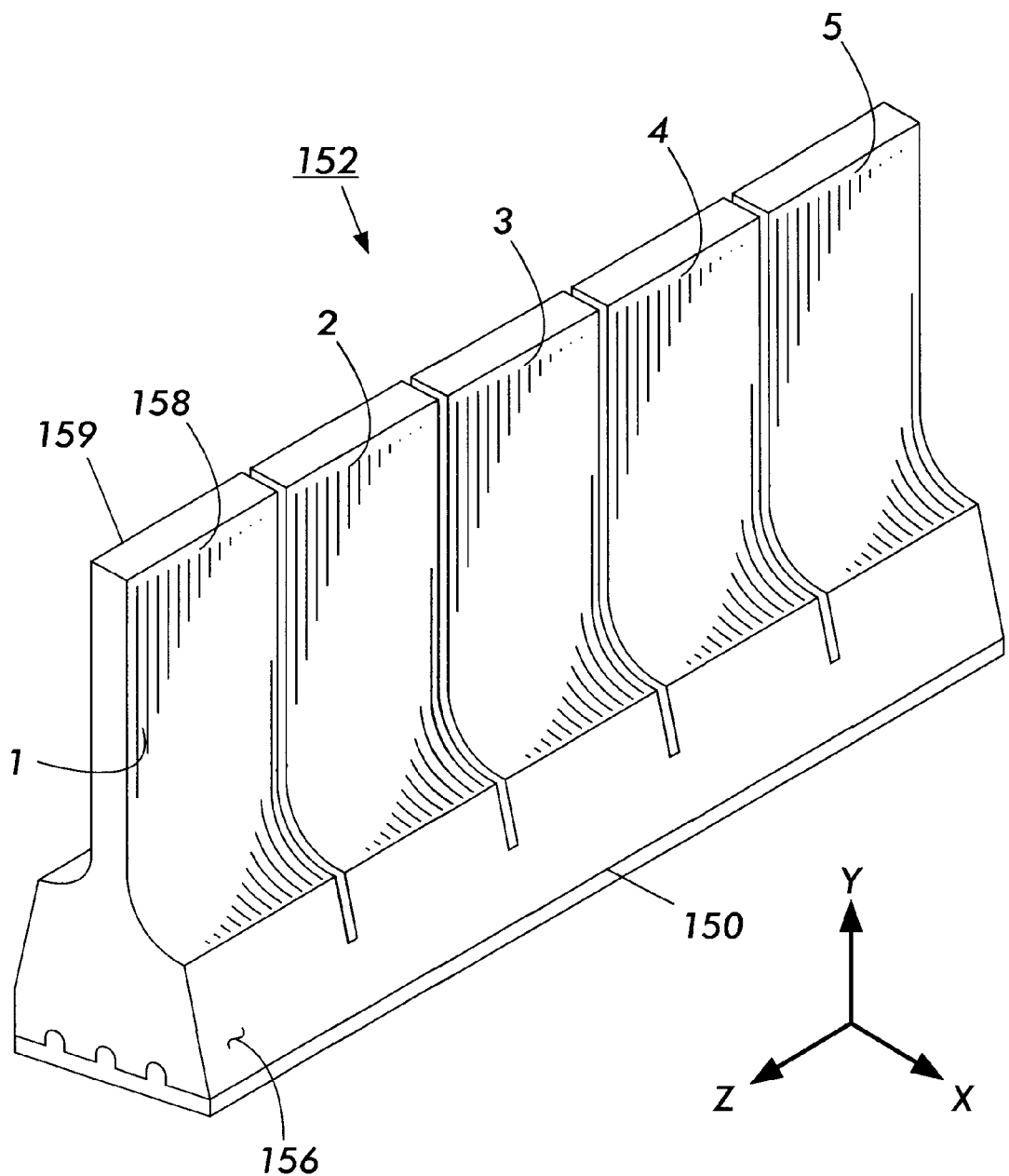
FIG. 8 is a perspective view of a resonator of the invention wherein the platform portion of the horn member includes a track.
Figure 9:
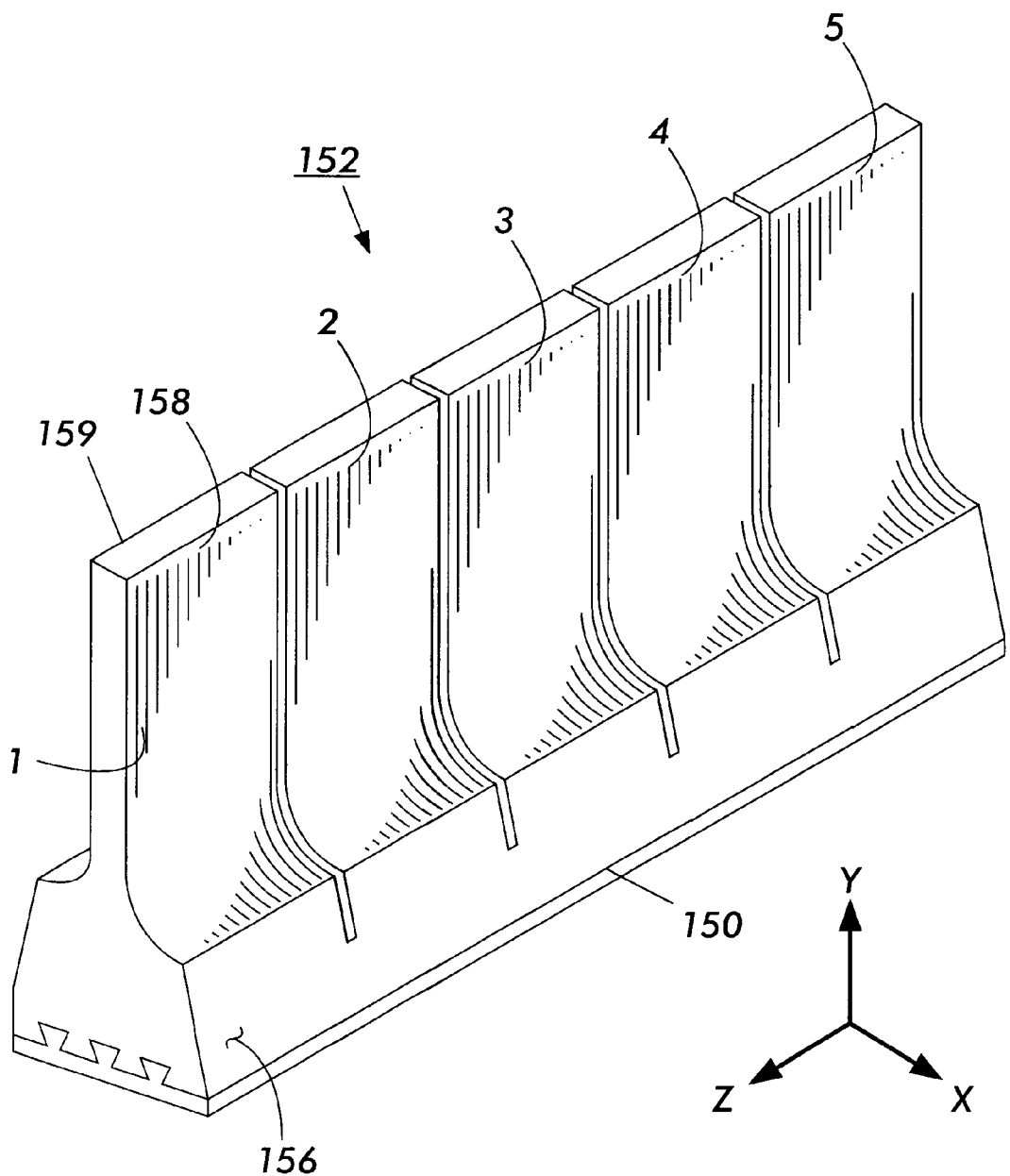
FIG. 9 is a perspective view of a resonator of the invention wherein the platform portion of the horn member includes a dove-tail.

Another bending method can take advantage of the formation process for the piezoceramic material, i.e., the injection mold process. In this bonding method, the piezoceramic can be directly shaped and molded onto the surface of the waveguide, and polymer optionally inserted therein after molding. The platform section of the horn assembly can be made to have a track extension (example of which is shown in FIG. 8) or dove-tail design (example of which is shown in FIG. 9) to increase the integrity of the bond between the components. A different possible option utilizing the mold bonding approach could be to mold the piezoceramic material sandwiched between two metal electrodes, thereby improving the electrical signal to the piezo layer and also providing a good surface to bond to the horn member. The voids in the piezoceramic could subsequently be filled with polymer or left open to air.

Beyond significantly improving the vibrational performance of a resonator incorporating the transducer composite element, the piezoelectric composite of the present invention offers additional advantages over transducers and resonators of the prior art. For example, the composite and the 1–3 configuration can readily be fabricated to a size such that a one piece element of the composite can be used to span across all of the horn sections of the resonator without falloff of vibrational performance. For example, the composite can have a size of about 16 inches long, about 0.5 inches wide and about 0.125 inches thick. Preferably, the thickness of the composite ranges from about a few micrometers to about a few millimeters, selected based upon desired vibration amplitude. Of course, reduced lengths can also be produced if desired to maintain a multiple segment configuration such as known in the prior art while still affording the reduced transverse vibration energy coupling. In addition, the composite material can provide an easier method of bonding the piezoelectric material to the horn member as discussed above.

Piezoelectric composite layer may be poled by applying a sufficiently large electric field across the thickness of the structure. A conductive layer, such as aluminum, may be deposited over the composite surface by using such means as chemical vapor deposition or electrochemical deposition. Conductive paint materials may be applied, such as silver print, or conductive polymeric materials may be overcoated onto the piezoelectric composite. Density and thickness of the conductive layer may be selected to provide additional mass for the transducer design. The thickness of the conductive layer may range from about a few angstroms to about a few millimeters. Electrical leads, preferably conductive adhesive copper foil such as manufactured by 3M, are attached to the conductive layer and then to the power supply.

The contacting tip portion 159 of horn member 152 may be brought into a tension or penetration contact with non-rigid belt member 10, so that movement of the tip carries belt 10 in vibrating motion. Penetration can be measured by the distance that the horn tip protrudes beyond the normal position of the belt, and may be in the range of, for example, about 1.5 to about 3.0 mm. It should be noted that increased penetration produces a ramp angle at the point of penetration. For particularly stiff sheets, such an angle may tend to cause lift at the trail edges thereof.

Figure 7:
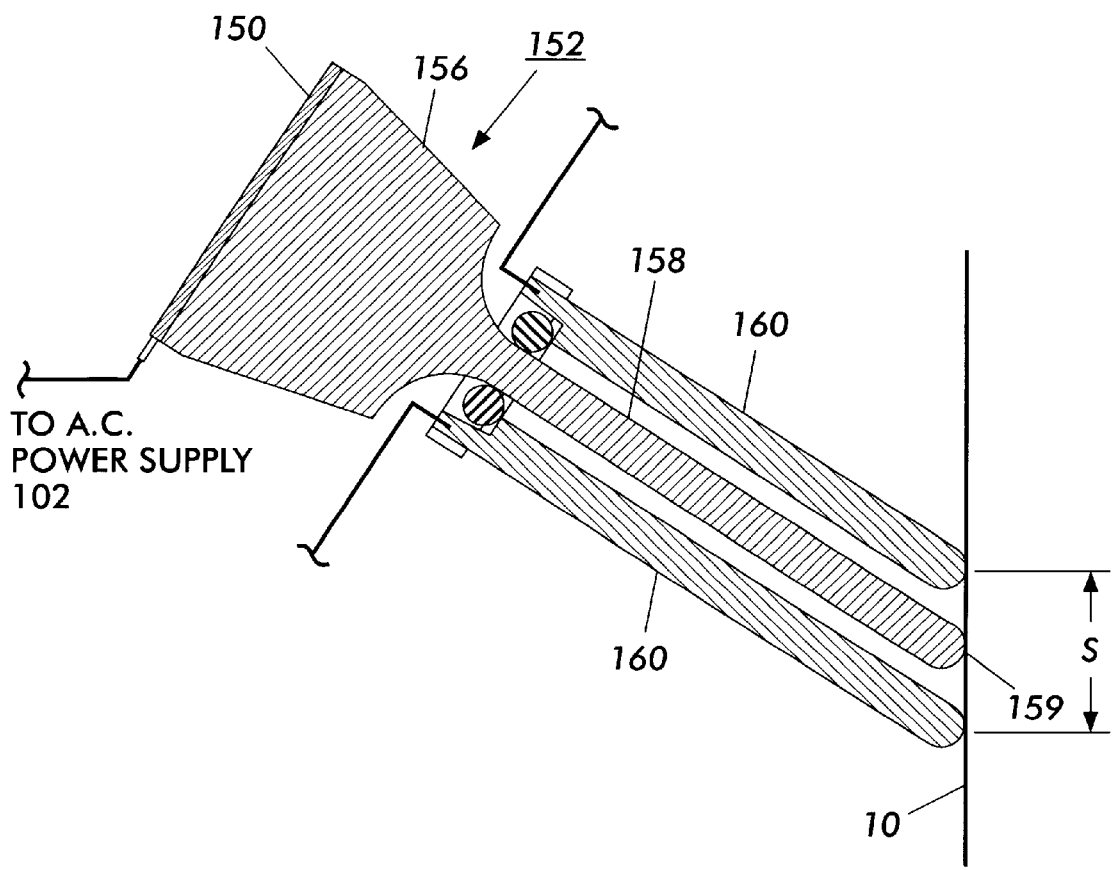
FIG. 7 is a sectional elevational view of one embodiment of the resonator of the invention.

As shown in FIG. 7, to provide a coupling arrangement for transmitting vibratory energy from a resonator 100 to belt 10, the resonator may preferably be arranged with electrodes 160 to provide engagement of resonator 100 to belt 10 without penetrating the normal plane of the photoreceptor. Alternatively, these electrodes 160 may be replaced by plenum walls if vacuum coupling is applied. Horn tip 158 may extend through electrodes 160, which are connected to a high voltage source. Electrodes 160 are approximately parallel to horn tip 158, extending to approximately a common plane with the contacting tip 159, and forming together an opening adjacent to the belt 10, at which the contacting tip contacts the belt. When voltage is applied by a high voltage supply (not shown) to electrodes 160, belt 10 is drawn into contact with electrodes 160 and contacting tip 159, so that contacting tip 159 imparts the ultrasonic energy of the resonator to belt 10. Interestingly, electrodes 160 also tend to damp vibration of the belt outside the area in which vibration is desired, so that the vibration does not disturb the dynamics of other operations, e.g., sheet tacking or detacking, on the belt, or the integrity of the developed image prior to the transfer field.

The electrostatic tacking force can be applied using either D.C. or A.C. biases to promote electrostatic fields into the bulk of the photoreceptor backside. This can occur without effecting the photoreceptor imaging function. It is preferred that the photoreceptor structure comprises an electrically insulative anti-curl backing coating in direct contact with the resonator followed by a support layer. These insulative layers occurring prior to the photoreceptor ground plane in the photoreceptor structure serve to electrically isolate the electrostatic tacking function from the photoreceptor imaging function.

In a preferred embodiment of the invention in which the resonator is used to assist in transfer of a toner image from the belt surface to an image receiving substrate surface, application of high frequency acoustic or ultrasonic energy to belt 10 occurs within the area of application of transfer field, and preferably within the area under transfer corotron 40 (see FIG. 2). While transfer efficiency improvement appears to be obtained with the application of high frequency acoustic or ultrasonic energy throughout the transfer field, in determining an optimum location for the positioning of resonator 100, it has been noted that transfer efficiency improvement is strongly a function of the velocity of the contacting tip 159. The desirable position of the resonator is approximately opposite the centerline of the transfer corotron. For this location, optimum transfer efficiency was achieved for tip velocities in the range of, for example, about 300 to about 500 mm/sec., depending on toner mass. At very low tip velocity, from about 0 mm/second to about 45 mm/sec, the positioning of the transducer has relatively little effect on transfer characteristics. Restriction of application of vibrational energy, so that the vibration does not occur outside the transfer field, is preferred. Application of vibrational energy outside the transfer field tends to cause greater electromechanical adherence of toner to the surface creating a problem for subsequent transfer or cleaning.

Any suitable shape may be selected for the horn member. A stepped shape, with a generally rectangular base portion 156 and a stepped horn tip 158 as illustrated in the Figures is preferred. Other shapes such as, for example, a trapezoidal shape, with a generally rectangular base 156 and a generally triangular tip portion 158, with the base of the triangular tip portion having approximately the same size as the base, may also be used. In general, the trapezoidal horn appears to deliver a higher natural frequency of excitation, while the stepped horn produces a higher amplitude of vibration. The height H of the horn appears to have an effect on the frequency and amplitude response. Desirably, the height H of the horn may fall in the range of about 1 to about 1.5 inches (2.54 to 3.81 cm), with greater or lesser lengths not excluded. The ratio of the base width $W_B$ to tip width $W_T$ also effects the amplitude and frequency of the response with a higher ratio producing a marginally higher frequency and a greater amplitude of vibration. The ratio of $W_B$ to $W_T$ is desirably in the range of, for example, about 3:1 to about 10:1. The length L of the horn across belt 10 also effects the uniformity of vibration, with the longer horn producing a less uniform response.

In FIG. 3, a partial horn segmentation is shown where the tip portion 158 of the horn 152 is cut perpendicularly to the plane of the imaging surface, and generally parallel to the direction of imaging surface travel, but not cut through the contacting tip 159 of the horn, while a continuous piezoelectric transducer 150 is maintained. Such an arrangement, which produces an array of horn segments 1 to 5, provides a velocity response along the array of horn segments 1–5 along the horn tip which is from about 0.18 in/sec/v to about 0.22 in/sec/v, when excited at a frequency of 73.2 kHz.

When horn 152 is fully segmented, each horn segment tends to act as an individual horn. When the horn is segmented though the tip, producing an open-ended slot, each segment acts more or less individually in its response. It will be understood that the exact number of segments may vary from the 5 segments shown in the examples and described herein. The length $L_s$ of any segment is selected in accordance with the height H of the horn, with the ratio of H to $L_s$ falling in a range of, for example, greater than about 1:1, and preferably about 3:1.

The invention has been described with reference to preferred embodiments. Obviously modifications will occur to others upon reading and understanding the specification taken together with the drawings. Various alternatives, modifications, variations or improvements may be made by those skilled in the art from this teaching which are intended to be encompassed by the following claims.

What is claimed is:

1. A resonator for applying vibrational energy to a member, comprising:
    an energy transmitting horn member having a platform portion and a horn portion, the horn portion including a contacting portion for contacting a surface of the member; and
    a piezoelectric material in association with the horn member for driving the horn member to vibrate, the piezoelectric material responsive to a voltage signal from a voltage source, wherein the piezoelectric material comprises a composite of at least one piezoceramic material and at least one of a polymer or air, and wherein the composite has a 1–3 configuration.

2. The resonator according to claim 1, wherein the at least one piezoceramic material is selected from the group consisting of lead zirconate titanate, barium titanate and lead titanate.

3. The resonator according to claim 2, wherein the at least one piezoceramic material is lead zirconate titanate.

4. The resonator according to claim 1, wherein the at least one polymer is selected from the group consisting of epoxy, silicone resin and cyanoacrylate.

5. The resonator according to claim 1, wherein the at least one polymer is epoxy.

6. The resonator according to claim 1, wherein the 1–3 configuration comprises aligned lead zirconate titanate rods with one or more polymers or air.

7. The resonator according to claim 1, wherein the composite is directly bonded to the horn member without a separate bonding layer.

8. The resonator according to claim 1, wherein the composite is sandwiched between two metal electrodes, one of the electrodes being bonded to the horn member.

9. The resonator according to claim 1, wherein the horn portion of the horn member includes a plurality of linearly arranged horn elements, each horn element having a contacting portion for contacting the surface of the member, and wherein the piezoelectric material has a width extending across all the horn elements.

10. A method of making the resonator of claim 1, comprising directly injection molding the composite onto the platform portion of the horn member.

11. The method according to claim 10, wherein the platform portion of the horn member includes a track or dove tail.

12. An imaging apparatus comprising at least a non-rigid member with a charge retentive surface moving along an endless path, an image forming station for creating a latent image on the charge retentive surface, a development station with at least one developer member for imagewise developing the latent image with toner, a transfer station for electrostatically transferring the developed toner image to a substrate, and a resonator for applying vibrational energy to the non-rigid member, the resonator comprising:
    an energy transmitting horn member having a platform portion and a horn portion, the horn portion including a contacting portion that contacts a surface of the non-rigid member, developer member or both; and
    a piezoelectric material in association with the horn member for driving the horn member to vibrate, the piezoelectric material responsive to a voltage signal from a voltage source, wherein the piezoelectric material comprises a composite of at least one piezoceramic material and at least one of a polymer or air, and wherein the composite has a 1–3 configuration.

13. The imaging apparatus according to claim 12, wherein the imaging apparatus further includes a voltage source that provides a voltage signal to the piezoelectric material.

14. The imaging apparatus according to claim 12, wherein the at least one piezoceramic material is selected from the group consisting of lead zirconate titanate, barium titanate and lead titanate.

15. The imaging apparatus according to claim 14, wherein the at least one piezoceramic material is lead zirconate titanate.

16. The imaging apparatus according to claim 12, wherein the at least one polymer is selected from the group consisting of epoxy, silicone resin and cyanoacrylate.

17. The imaging apparatus according to claim 12, wherein the at least one polymer is epoxy.

18. The imaging apparatus according to claim 12, wherein the 1–3 configuration comprises aligned lead zirconate titanate rods with one or more polymers or air.

19. The imaging apparatus according to claim 12, wherein the composite is directly bonded to the horn member without a separate bonding layer.

20. The imaging apparatus according to claim 12, wherein the composite is sandwiched between two metal electrodes, one of the electrodes being bonded to the horn member.

21. The imaging apparatus according to claim 12, wherein the horn portion of the horn member includes a plurality of linearly arranged horn elements, each horn element having a contacting portion for contacting the surface of the member, and wherein the piezoelectric material has a width extending across all the horn elements.

22. The imaging apparatus according to claim 12, wherein the horn member contacts the surface of the non-rigid member at or near the transfer station.

* * * * *